United States Patent [19]

Colles

[11] Patent Number: 4,899,151
[45] Date of Patent: Feb. 6, 1990

[54] APPARATUS FOR CONVERTING DIGITAL VALUES TO ANALOG VALUES

[75] Inventor: Joseph H. Colles, Oceanside, Calif.

[73] Assignee: Brooktree Corporation, San Diego, Calif.

[21] Appl. No.: 915,784

[22] Filed: Oct. 6, 1986

[51] Int. Cl.[4] .............................................. H03M 1/68
[52] U.S. Cl. ..................................... 341/145; 341/136
[58] Field of Search ................ 340/347 DA; 341/136, 341/144, 145, 153, 150

[56] References Cited

U.S. PATENT DOCUMENTS 4,490,634  12/1984  Hareyama .................... 340/347 DA

FOREIGN PATENT DOCUMENTS 56-75726  6/1981  Japan ............................. 340/347 DA

OTHER PUBLICATIONS

Schoeff, "IEEE Journal of Solid-State Circuits", vol. SC-14, No. 6, Dec. 1979, pp. 904-911.

Primary Examiner—William M. Shoop, Jr.
Assistant Examiner—Marc S. Hoff
Attorney, Agent, or Firm—Ellsworth R. Roston; Charles H. Schwartz

[57] ABSTRACT

A plurality of members, each constructed to produce a substantially constant current when energized, are disposed electrically in a matrix defined by a plurality of rows and a plurality of columns. A plurality of signals cumulatively represent a digital value. Each of the signals has logic levels respectively coding for binary "1" and binary "0" and each has an individual binary significance. The binary signals of intermediate binary significance are decoded to activate an individual rows. The binary signals of high binary significance are decoded to activate an individual column. The member common to the activated row and the activated column then receives a substantially constant current, as do all of the members of lower binary signficance than such common member. The signals of lowest binary significance are also decoded to produce a current having a magnitude indicative of the binary value coded by such signals. This magnitude corresponds to that obtained by multiplying a particular portion of the substantially constant current by a ratio having as a numerator the value represented by the binary signals of least binary significance and having as its denominator the maximum value capable of being coded by such binary signals. The current coding for the binary signals of the least binary significance passes through a member otherwise superfluous in the matrix and preferably having an extreme position electrically in the matrix. The currents flowing through the members in the matrix are added in an output line to indicate an analog of the digital value.

14 Claims, 2 Drawing Sheets

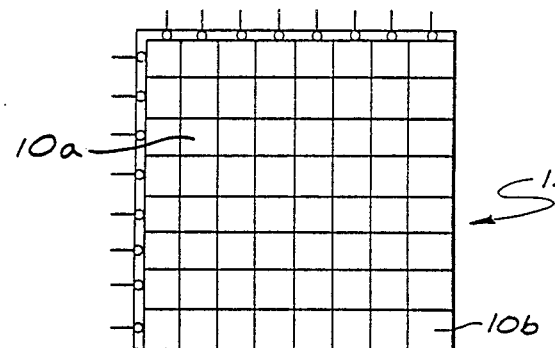
FIG. 4
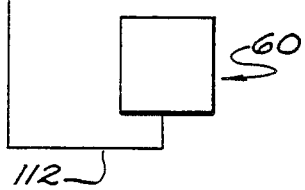
FIG. 5
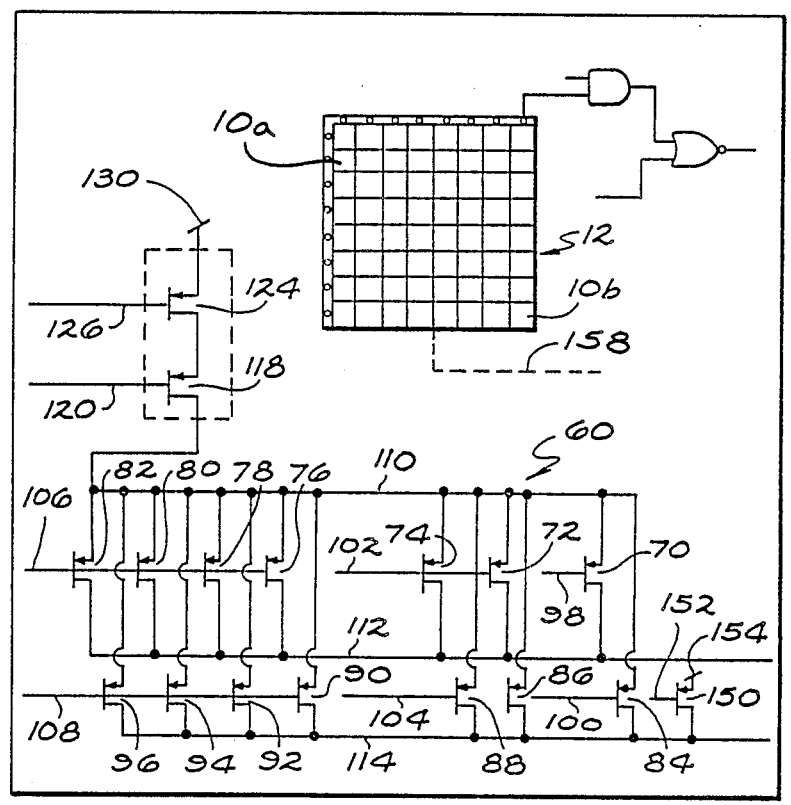

APPARATUS FOR CONVERTING DIGITAL VALUES TO ANALOG VALUES

This invention relates to apparatus for converting a digital value to an analog value. More particularly, this invention relates to a digital-to-analog converter which is disposed on an integrated circuit chip, is monotonic and provides an increase in the number of binary bits capable of being disposed on the chip in a limited amount of space.

Since the development of integrated circuit chips, engineers have been consistently able to provide through the years integrated circuit chips which provide enhanced numbers of transistors on the chips even as the area occupied by the chips has decreased. For example, integrated circuit chips are now in use which provide hundreds, and even thousands, of transistors in an area no greater than approximately one quarter of an inch (¼") by one quarter of an inch (¼").

One would ordinarily expect that the enhanced number of components on the chip, simultaneously with the decrease in the size of the chips, would be sufficient to satisfy all requirements imposed by manufacturers of data processing equipment. The opposite has been true. As the size of the chips has decreased simultaneously with an increase in the number of transistors on the chips, the requirements for enhanced performance and decreased size in the integrated circuit chips have increased rather than decreased. This has resulted in part from the increased speeds and accuracies which data processors incorporating such chips are able to attain.

As will be appreciated, data processors operate on a digital basis. However, when the data processors are included in control systems, the parameters to be controlled are measured on an analog basis. These parameters may be such every day phenomena as temperature, pressure and humidity or they may be more esoteric phenomena such as moduli of elasticity. Apparatus accordingly has to be provided for converting into an analog form digital data processed by the converter and for converting into a digital form the analog measurements of the parameters such as temperatures, pressures, humidity and moduli of elasticity. This is particularly true in closed loop systems in which the analog measurements are introduced to the data processors which process the information and provide signals for operating controls to charge the values of the analog measurements.

As the speed and accuracy of data processors have increased, the requirements for converting between digital and analog values at the same speed and accuracy have kept pace. The requirements have, if anything, been increased in stringency because the space available in the data processors for such conversion has been limited. For example, requirements now exist for converting between digital and analog values on a monotonic basis with an error of less than one (1) bit out of $2^{16}$ bits. Furthermore, these conversions are often required to occur on a chip having an area no greater than one quarter of an inch (¼") by one quarter of an inch (¼").

As will be appreciated, the number of transistors on an integrated circuit chip generally doubles every time that the number of binary bits being processed on the chip increases by one binary integer. Thus, when the number of binary bits being processed on the chip increases from twelve (12) to sixteen (16), the number of transistors on the chip is multiplied by sixteen (16). This imposes a considerable burden on a designer of integrated circuit chips, especially when the designer is limited as to the amount of area which can be used for the integrated circuit chip.

Various attempts have been made in digital-to-analog converters to provide chips which can meet the requirements specified above. These attempts have not been entirely successful. The requirements for conversion of a specified number of binary bits into a corresponding analog value with monotonicity in a limited amount of space on an integrated circuit chip are often greater than the ability of a designer to meet such requirements.

This invention provides a digital-to-analog converter which provides a distinct advance in the art in overcoming the disadvantages discussed above. The converter of this invention is able to provide a conversion of more binary bits with monotonicity in a specified amount of space than the converters of the prior art. The invention accomplishes this by increasing the number of binary bits which are capable of being displayed in a thermometer converter without expanding the size of the matrix in the converter.

In one embodiment of the invention, a plurality of members, each constructed to produce a substantially constant current when energized, are disposed in a matrix defined by a plurality of rows and a plurality of columns. A plurality of signals cumulatively represent a digital value. Each of the signals has logic levels respectively coding for a binary "1" and a binary "0" and each has an individual binary significance.

The binary signals of intermediate binary significance are decoded to activate an individual one of the rows. The binary signals of high binary significance are decoded to activate an individual one of the columns. The member common to the activated row and the activated column then receives a substantially constant current, as do all of the members of lower binary significance than such common members.

The signals of the lowest binary significance are also decoded to produce a current having a magnitude indicative of the binary value coded by such signals. This magnitude corresponds to that obtained by multiplying a particular portion of the substantially constant current by a ratio having as its numerator the value represented by the binary signals of least binary significance and having as its denominator the maximum value capable of being coded by such binary signals.

The current coding for the binary signals of the least binary significance passes through a member otherwise superfluous in the matrix and preferably having an extreme position electrically in the matrix. This current is added in an output line to the sum of the currents flowing through the members in the matrix to provide an analog indication of the digital value.

In the drawings:

FIG. 4 is a schematic diagram illustrating the introduction of the current to the superfluous one of the members in the matrix shown in FIG. 1; and FIG. 5 illustrates an integrated circuit chip including the matrix shown in FIG. 1 and circuitry corresponding to the circuitry shown in FIG. 2 and 3.

In one embodiment of the invention, a plurality of output members 10 are disposed in a matrix arrangement generally indicated at 12. Each of the output members may be a transistor such as disclosed in application Ser. No. 383,544 (now abandoned in favor of application Ser. No. 724,829) filed by Henry Katzenstein or may be a capacitor such as disclosed in application Ser. No. 553,041 filed by Henry Katzenstein. Applications Ser. Nos. 383,544 and 553,041 are assigned of record to the assignee of record of this application.

Figure 1:
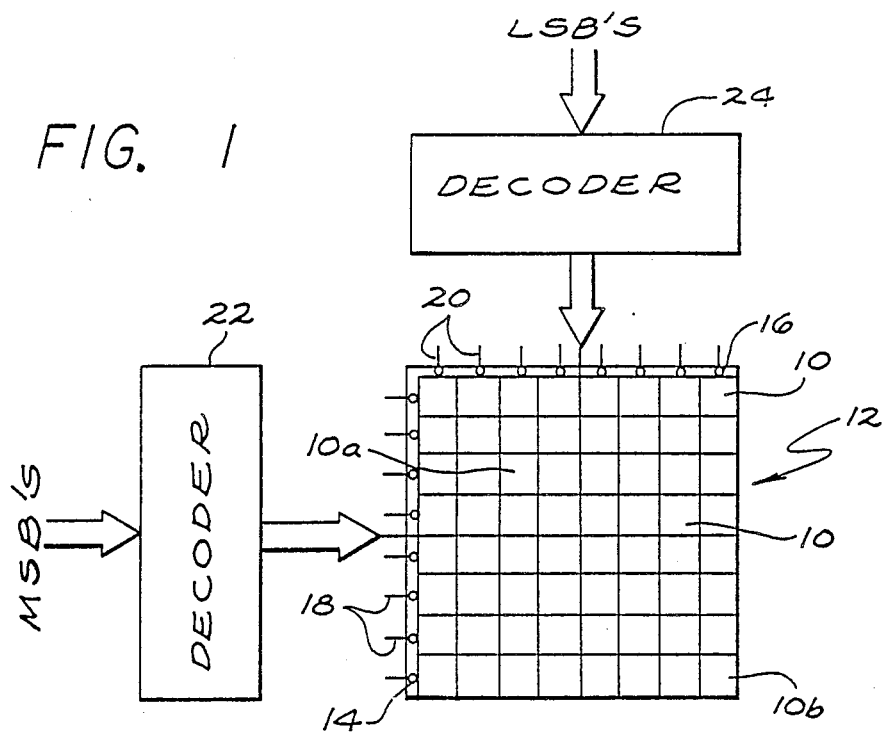
FIG. 1 is a schematic diagram of a matrix including a plurality of output members for converting digital values into corresponding analog values.

The matrix arrangement 12 may be in any form, preferably in a form defined by the output members being disposed electrically in a pair of coordinate axes. In the embodiment shown in FIG. 1, the matrix arrangement is defined by a plurality of rows and a plurality of columns. The matrix arrangement shown in FIG. 1 provides eight rows and eight columns but any number of rows or columns may be used. Input terminals 14 are provided to each of the rows in the matrix 12 and input terminals 16 are provided to each of the columns in the matrix.

Input signals in a first plurality are introduced through lines 18 to the input terminals 14 and input signals in a second plurality are introduced through lines 20 to the input terminals 16. The input signals to the lines 18 are in a form such that all of the signals have a binary "0" except for one signal which has a binary "1". This signal prepares all of the output members 10 to become activated in the row receiving this signal. The input signals in the lines 18 may be obtained by decoding three (3) binary signals which are coded in a pattern to indicate the particular row to be prepared for activation at each instant. The three signals are introduced to a decoder 22 which operates to decode the signals into the eight signals which are introduced to the inputs 14.

In like manner, a decoder 24 is provided to decode three input signals in a second plurality. The three (3) input signals in the second plurality are decoded into eight signals which are introduced through the lines 20 to the inputs 16. The eight (8) signals are decoded in a manner such that a binary signal coding for a binary "1" is produced for the column having the particular binary bit to be activated and a binary signal coding for a binary "1" is also produced for the columns preceding such columns. For example, for signals coding for the analog value "19", signals coding for a binary "1" are produced for the first three (3) columns. The signals introduced to the decoder 24 may constitute least significant bits (LSB's in FIG. 1) and the signals introduced to the decoder 22 may constitute most significant bits (MSB's in FIG. 1). The decoders 22 and 24 are conventional in the prior art.

As will be seen, when a row and a column are prepared for activation, a particular one of the output members 10 common to the prepared row and the prepared column becomes activated. For example, an output member 10a common to the third row and the third column may be activated at a particular instant. This indicates that the analog value is "19" since the output member 10a is the nineteenth output member counting (in the form of a raster scan) from the top row and the left column as a starting position.

Figure 2:
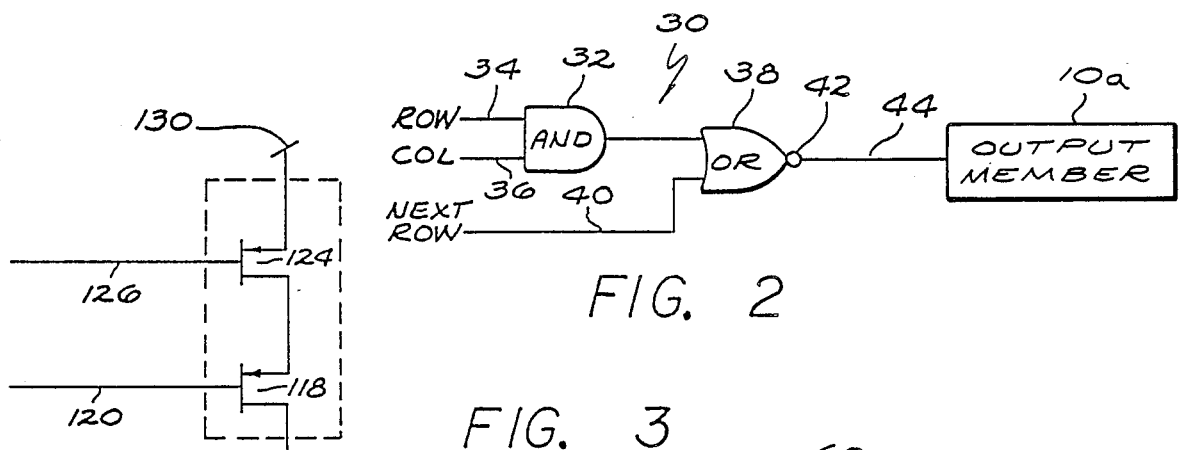
FIG. 2 is a diagram of electrical circuitry for energizing individual ones of the output members in the matrix shown in FIG. 1.

FIG. 2 illustrates a circuit, generally indicated at 30, for activating output members such as the output member 10a (FIG. 1) and all of the output members preceding the output member 10a. Specifically, the circuit shown in FIG. 2 illustrated as energizing the output member 10a in FIGS. 1 and 2. A circuit similar to that shown in FIG. 2 may be provided for each of the outputs members 10 in FIG. 1 except for an output member 10b.

The circuit 30 includes an "AND" network 32 which network 32 which receives a signal on a line 34 corresponding to the line 18 (FIG. 1) for the third row and also receives a signal on a line 36 corresponding to the line 20 (FIG. 1) for the third column. As a result, the "AND" network 32 in FIG. 2 provides an output when the third row and the third column become prepared for activation. At the same time, the "AND" networks for each of the output members in the first and second columns in the third row become activated.

The output signal from the "AND" network 32 is introduced to an "OR" network 38 which also receives the input from a line 40. The output from the "OR" network 38 is introduced to an inverter 42 and the output from the inverter 42 is passed to a line 44. An individual circuit 30 such as shown in FIG. 2 and described above is associated with each of the output members 10 in the matrix 12.

The output member 10a is activated when signals simultaneously pass through the lines 34 and 36 to the "AND" network 32. When the output member 10a becomes activated, all of the output members 10 in the rows preceding the output member 10a become simultaneously activated. This occurs by a passage of a signal through the line 40 for the circuits 30 controlling the activation of the output members 10 in each of the first and second rows in FIG. 1. The signal on the line 40 for the circuits 30 controlling the activation of each of the output members in the first and second rows may be obtained from the signal on the input line 34 to the third row.

As will be seen from FIG. 2, the output member 10a and all of the output members preceding the output member 10a are simultaneously activated when the analog value is "19". Each of the activated output members 10 produces a substantially constant current by circuitry such as disclosed in detail in co-pending application Ser. No. 714,503 filed by me on Mar. 21, 1985, for "Apparatus for Converting Between Digital and Analog Values" and designed of record to the assignee of record in this application. These constant currents in the different output members are accumulated in a single output line indicated in broken lines at 50 in FIG. 5. The current on the output line 50 has a magnitude corresponding to the analog value of "19" in the example discussed in the previous paragraphs. Since this output current is obtained from a number of output members 10 each providing a substantially constant current, the output from the converter shown in FIG. 1 is monotonic.

As will be appreciated, the circuits for activating the output members in the top row in FIG. 1 do not need the line 40 in FIG. 2. This results from the fact that there are no preceding rows of output members to be activated when the output members in the top row in FIG. 1 are being activated. Furthermore, the lines corresponding to the line 36 (FIG. 2) can receive an activating voltage at all times for the output members in the first column in FIG. 1. This results from the fact that the output member common to the first column and a particular row is activated when any of the output members in that row is activated. This output member remains activated regardless of which output member in the row is thereafter activated.

The output members 10 in the matrix 12 may be disposed on an integrated circuit chip generally indicated at 50 in FIG. 5. As will be seen, the integrated circuit chip 50 includes the matrix 12. For a matrix 12 having eight (8) rows and eight (8) columns, a total of sixty-four (64) output members are disposed on the chip 50. These sixty-four (64) output members decode a total of six (6) binary bits. Three (3) of these binary bits control the activation of the rows in the matrix and the other three (3) binary bits control the activation of the columns in the matrix.

When six (6) binary bits are converted into an analog value, analog values between "0" and "63" are produced. However, since there are sixty-four (64) output members 10 in the matrix 12, one (1) of the output members 10 may be considered to be superfluous. By way of illustration, an output member 10b in FIGS. 1 and 5 may be considered to be superfluous. Generally the output member 10b at the lower right corner of the matrix is considered to be superfluous in order to provide a progression of analog values between "0" and "63" in the matrix without any discontinuity in the progressive positions of the output members being energized for such progressive values.

This invention provides for the use of the output menber 10b in indicating the value of binary bits of least binary significance. For example, the output member 10b may be connected to the circuitry shown in FIG. 3 for indicating the analog value of the three (3) least significant binary bits (less significant than the binary significance of the binary signals introduced to the decoders 22 and 24) when the matrix 12 is expanded to indicate the analog value of the nine (9) binary bits. In this way, for example, the converter of this invention is able to convert thirteen (13) binary bits to an analog value on a monotonic basis by including only ten hundred and twenty-four (1024) output members in the matrix 12 instead of the eight thousand one hundred and ninety-two (8192) output members which would otherwise be required. It will be appreciated that the matrix 12 converts only six (6) binary bits instead of the, nine (9) binary bits discussed previously in this paragraph and that the matrix can be expanded to decode the ten (10) binary bits.

Figure 3:
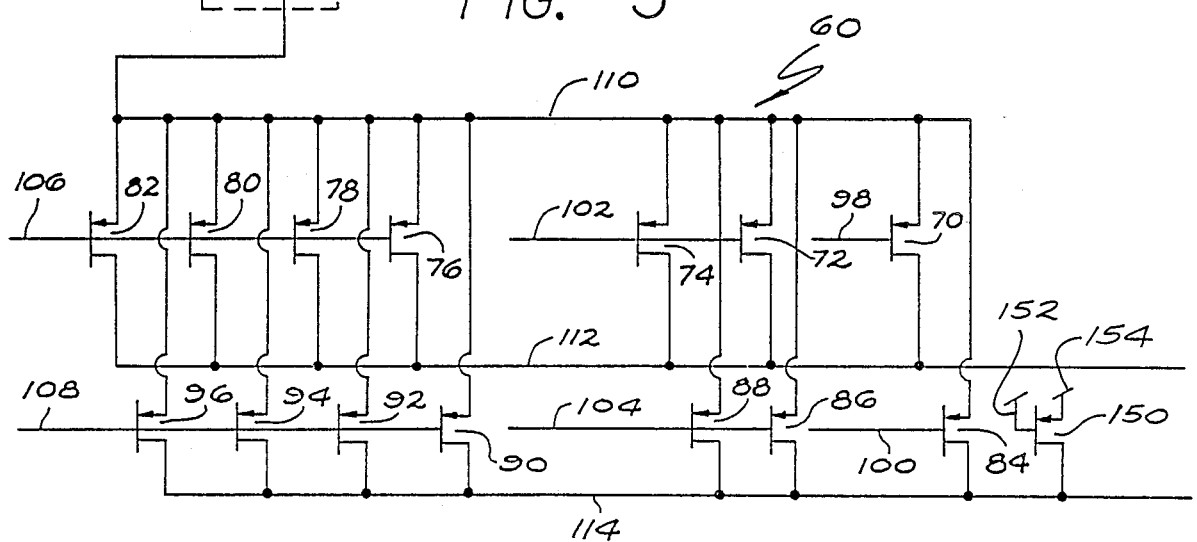
FIG. 3 is a diagram of electrical circuitry for converting binary bits of low binary significance in the digital value into a current for introduction to an individual and superfluous one of the members in the matrix shown in FIG. 1.

FIG. 3 illustrates circuitry generally indicated at 60 for converting signals representing the three (3) least significant binary bits (less significant than the binary bits converted by the matrix 12) into a current having a magnitude representing the analog value. The circuitry shown in FIG. 4 includes transistors 70 through 82 (even numbers only) and transistors 84 through 96 (even numbers only). The gates of the transistors 70 and 84 respectively receive from lines 98 and 100 signals representing true and false values of the least significant bit ($2^0$ and $\bar{2}^0$). The gates of the transistors 72 and 74 receive from a line 102 signals representing the true state of the second least significant binary bit ($2^1$), and the transistors 86 and 88 have signals introduced to their gates from a line 104 to represent the false state of the second least significant binary bit ($\bar{2}^1$). In like manner, signals are introduced to the gates of the transistors 76, 78, 80 and 82 from a line 106 to represent a true state for the third least significant digit ($2^2$) and signals are introduced to the gates of the transistors 90, 92, 94 and 96 from a line 108 to represent a false state for the third least significant digit ($\bar{2}^2$).

The sources of the transistors 70 through 96 (even numbers only) are connected to a line 110. The drains of the transistors 70 through 82 have common connections with an output line 112 and the drains of the transistors 84 through 9 (even numbers only) have common connections with a reference line 114. A connection is made from the line 100 to the drain of a transistor 118, the gate of which receives a control potential on a line 120. The drain of the transistor 118 is common wth the source of a transistor 124 having a gate connected to a biasing line 126. The source of the transistor 126 receives an energizing potential from an energizing source 130.

A biasing potential is introduced to the gate of the transistor 124 through the line 126 to produce a substantially constant current through the transistor. This current flows through the conductive ones of the transistors 70 through 96 (even numbers only). The current cumulatively flowing through the conductive ones of the transistors 70 through 96 (even numbers only) is substantially equal to seven eighths of the current flowing through each of the output members 10 when the output members are energized as discussed above. A potential is introduced through the line 120 to the gate of the transistor 118 to maintain at a desired level the impedance of the circuitry shown in FIG. 3.

For a binary value of "1" for the least significant binary bit ($2^0$), current flows through the transistor 70 to the output line 112. Similarly, current flows through the transistor 84 to the reference line 114 when the least significant binary bit has a value of "0" ($2^0$). As will be appreciated, current flows through the transistors 72 and 74 for a binary value of "1" for the second least significant binary bit ($2^1$) and through the transistors 86 and 88 for a binary value of "0" for the second least significant binary bit ($\bar{2}^1$). In like manner, current flows through the transistors 76, 78, 80 and 82 for a binary value of "1" for the third least significant binary bit ($2^2$) and through the transistors 90, 92, 94 and 96 for a binary value of "0" for the third least significant binary bit ($\bar{2}^2$).

As will be seen from the discussion in the previous paragraph, seven (7) of the transistors 70 through 76 (even numbers only) are energized at all times whether the three (3) least significant binary bits have binary values of "1" or binary values of "0". As a result, the load in the circuit including the transistors 18 and 124 remains constant under all possible combinations of binary "1" and binary "0" for the values of the three (3) least significant binary bits. This insures that the circuitry shown in FIG. 4 operates on a stable basis under all possible operating conditions.

The magnitude of the current flowing at each instant through the output line 112 is dependent upon the digital value coded by the logic levels of the three (3) least significant binary bits. For example, for an analog value of "1" as represented by a signal on the line 98, one seventh (1/7) of the current flowing through the transistors 118 and 124 flows through the output line 112 and six sevenths (6/7) of the current flowing through transistors 118 and 124 flows through the reference line 114. Similarly, when an analog value of "6" is produced as represented by signals on the lines 102 and 106, current flows through the transistors 72, 74, 76, 78, 80 and 82 and the output line 112. This corresponds to six sevenths (6/7) of the current flowing through the transistors 118 and 124.

The current flowing through the output line 112 also flows through the output member 10b in the matrix 12. This current flows through the line 112 in FIG. 4 from the current source 60 to the output member 10b. This current is combined with the current flowing through the energized ones of the output members 10 in the matrix 12 to produce a cumulative current on an output line 158 in FIG. 5. In this way, the current on the output line 150 represents on an analog basis the digital value coded by the binary signals introduced to the decoders 22 and 24 in FIG. 1 and also introduced to the circuitry 60 shown in FIG. 4. Because of this, the magnitude of the current on the output line 158 represents the analog equivalent of all of the binary signals introduced to the decoders 22 and 24 and the lines 98, 102 and 106.

A transistor 150 may also be included in the embodiment shown in FIG. 3. The drain of the transistor 150 is connected to the reference line 114 and the gate of the transistor 150 is connected to a line 152. The source of the transistor 150 is connected to an energizing source 154. The gate of the transistor 150 receives a potential on the line 152 to make the transistor strongly conductive. This causes the reference line 114 to receive the potential from the source 154 as a reference.

The converter shown in the drawings and disclosed above has certain important advantages. It converts digital values to analog values on a monotonic basis in a minimal amount of space. It provides this conversion by using an otherwise superfluous output member such as the member 10b and by producing in this output member a current representative of the value of the a particular number of least significant binary bits. In this way, a matrix otherwise capable of converting a particular number of binary bits such as ten (10) to an analog value is capable of converting an expanded number of binary bits such as thirteen (13) to the analog value.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for converting a digital value into an analog value,
    means for providing a plurality of first input signals each coding for an individual binary bit of relatively high binary significance and each having logic levels respectively coding for binary "1" and binary "0",
    a plurality of output members disposed electrically in a matrix relationship in a pair of co-ordinate directions,
    means responsive to the first input signals for energizing particular ones of the output members in the plurality, each with a particular magnitude, to indicate in analog form the binary value coded by the logic levels of the first input signals,
    there being an additional output member in the matrix relationship, such additional member being other than the output members in the plurality,
    means for providing a plurality of second input signals each coding for a binary bit of individual binary significance and of lower binary significance than the binary bits represented by the first input signals and each having logic levels respectively coding for a binary "1" and a binary "0",
    the first and second input signals cumulatively coding for the digital value,
    means for decoding the second input signals to produce an analog signal having an amplitude dependent upon such decoding and for energizing the additional output member with a magnitude, less than the particular magnitude, dependent upon the amplitude of such analog signal, and
    means for providing an output indication cumulatively representing the sum of the magnitudes of energizing the particular output members and the additional output member.

2. In a combination as set forth in claim 1,
    the energizing means responsive to the input signals providing for the flow of substantially constant current through each of the particularly output members and the decoding means being operative to provide in the additional output member a portion of such substantially constant current the binary value coded by the logic levels of the second input signals.

3. In a combination as set forth in claim 2,
    each of the output members constituting transistors and the additional output member constituting a transistor disposed at a particular position in the matrix relationship.

4. In a combination as set forth in claim 1,
    each of the output members constituting capacitors and the additional output member constituting a capacitor.

5. In a combination as set forth in claim 1,
    the matrix relationship defined by the output members being arranged in rows and columns, and the output members in the successive columns for each row, and the output members in the successive rows, being energized for progressive incremental increases in the digital value.

6. In combination for converting a digital value to an analog value,
    means for providing a plurality of input signals each coding for an individual binary bit having logic levels respectively coding for binary "1" and binary "0", the logic levels of the input signals cumulatively coding for the digital value,
    a plurality of output members disposed in a matrix arrangement defined by a pair of co-ordinate axes,
    means for decoding the logic levels of the input signals of greatest binary significance to produce a plurality of signals for introduction to the output members in the matrix arrangement to energize a particular number of such output members, each with a particular magnitude, dependent upon the digital value coded by such signals of greatest binary significance,
    means for decoding the logic levels of the input signals of lowest binary significance to produce an analog signal having a magnitude dependent upon the analog value coded by the logic levels of the input signals of lowest binary significance,
    there being an additional output member in the matrix arrangement, the additional output member being other than the output members in the plurality;
    means for energizing the additional output member in the matrix arrangement with a magnitude, less than the particular magnitude, dependent upon the analog value coded by the logic levels of the signals of lowest binary significance, and means for producing an output signal having a magnitude related to the cumulative energizing of the particular output members and the additional output member.

7. In a combination as set forth in claim 6, the decoding means for the signals of lowest binary significance providing a current of a substantially constant magnitude regardless of the digital value coded by the logic levels of the input signals of lowest binary significance and providing a particular portion of this current as the analog signal in accordance with the analog value represented by the logic levels of the input signals of lowest binary significance, and the additional member being superfluous in the matrix arrangement to the operation of the output members in a decoding the logic levels of the input signals of greatest binary significance.

8. In a combination as set forth in claim 7, each of the output members in the matrix arrangement, other than the additional output member, providing, when energized, a current of substantially the same magnitude.

9. In a combination as set forth in claim 7, the pair of coordinate axes in the matrix arrangement being defined by rows and columns, and the output members being progressively energized in each individual row, and the output members in each progressive row being progressively energized, after the energizing of all of the output members in the previous row, for progressive increases in the digital value.

10. In combination for converting a digital signal into an analog value, a plurality of output members disposed electrically in a plurality of rows and a plurality of columns defining a matrix arrangement, means for providing a plurality of first signals each having logic levels respectively coding for binary "1" and binary "0" and each having an individual binary significance, the first signals cumulatively coding in binary form for the digital value, means for decoding logic levels of the first signals of intermediate binary significance to provide signals identifying the output members in individual ones of the columns, means for decoding the logic levels of the first signals of highest binary significance to provide signals identifying the output members in individual ones of the rows, means responsive to the decoded signals identifying the output members in individual ones of the rows and the output members in individual ones of the columns for energizing, with a particular magnitude, the output member common to such individual ones of the rows and columns and for energizing all of the output members of a binary significance lower than the binary significance of such common output member, means responsive to the signals of lowest binary significance for producing an additional signal having a magnitude related to the logic levels of such signals, means for introducing the additional signal to an individual one of the output members to energize such individual member in accordance with the magnitude of such additional signal, such individual one of the output means being included in the matrix arrangement but not constituting any of the output members in the plurality, and means for providing an output signal cumulatively representing the magnitude of the signal in the additional output member and the magnitudes of the signals in the common output member and all of the output member of lower binary significance than the common output member.

11. In a combination as set forth in claim 10, the individual one of the output members having a particular position in the matrix arrangement.

12. In a combination as set forth in claim 10, each of the output members, other than the individual output member, being energized with a substantially constant current, means for producing a current having a substantially constant magnitude related to the substantially constant magnitude of the current in each of the output members other than the individual output member, and means for introducing a portion of the current from the last mentioned means to the individual output member in accordance with the logic levels of the signals of least binary significance.

13. In a combination as set forth in claim 12, means for providing a reference line, and means for producing a flow of current through the reference line with magnitude corresponding to the difference between the current of substantially constant magnitude related to the current through the energized output members and the current introduced to the individual output member.

14. In a combination as set forth in claim 10, the individual output member having a particular position in the matrix arrangement, the individual output member being used only to receive the additional signal, means for producing a current having a substantially constant magnitude related to the substantially constant magnitude in each of the output members other than the individual output member, and means for introducing a portion of the current from the last mentioned means to the individual output member in accordance with the logic levels of the signals of least binary significance.

* * * * *